United States Patent
Zatelli et al.

(10) Patent No.: US 6,624,471 B2
(45) Date of Patent: Sep. 23, 2003

(54) LATERAL DMOS TRANSISTOR WITH FIRST AND SECOND DRAIN ELECTRODES IN RESPECTIVE CONTACT WITH HIGH-AND LOW-CONCENTRATION PORTIONS OF A DRAIN REGION

(75) Inventors: Nicola Zatelli, Bergamo (IT); Massimo Atti, Bologna (IT); Elisabetta Palumbo, Milan (IT); Cosimo Torelli, Cernusco Sul Naviglio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/960,254

(22) Filed: Sep. 20, 2001

(65) Prior Publication Data

US 2002/0040995 A1 Apr. 11, 2002

(30) Foreign Application Priority Data

Sep. 21, 2000 (EP) .............................................. 00830628

(51) Int. Cl.$^7$ ........................... H01L 29/76; H01L 29/74
(52) U.S. Cl. ....................................... 257/335; 257/343
(58) Field of Search ................................. 257/335–337, 257/491, 492, 493, 339, 343, 408

(56) References Cited

U.S. PATENT DOCUMENTS 4,977,434 A * 12/1990 Delagebeaudeuf et al. . 257/287
6,002,301 A * 12/1999 Sugimura et al. ........... 330/277
6,303,961 B1 * 10/2001 Shibib ......................... 257/335

FOREIGN PATENT DOCUMENTS

| EP | 0 019 560 | * 11/1980 |
| EP | 0 035 453 A1 | * 9/1981 |
| EP | 0 267 768 A1 | * 5/1988 |

* cited by examiner

Primary Examiner—Minh Loan Tran
Assistant Examiner—Thomas L Dickey
(74) Attorney, Agent, or Firm—Lisa K. Jorgenson; Dennis M. de Guzman; Seed IP Law Group PLLC

(57) ABSTRACT

A lateral DMOS transistor having a drain region which comprises a high-concentration portion with which the drain electrode is in contact and a low-concentration portion which is delimited by the channel region. In addition to the conventional source, drain, body and gate electrodes, the transistor has an additional electrode in contact with a point of the low-concentration portion of the drain region which is close to the channel. The additional electrode permits a direct measurement of the electric field in the gate dielectric and thus provides information which can be used both for characterizing the transistor and selecting its dimensions and for activating devices for protecting the transistor and/or other components of an integrated circuit containing the transistor.

15 Claims, 3 Drawing Sheets

LATERAL DMOS TRANSISTOR WITH FIRST AND SECOND DRAIN ELECTRODES IN RESPECTIVE CONTACT WITH HIGH-AND LOW-CONCENTRATION PORTIONS OF A DRAIN REGION

BACKGROUND OF THE INVENTION

1. Field of the Invention

The present invention relates to semiconductor devices and, more particularly, to a lateral DMOS field-effect transistor.

2. Description of the Related Art

A lateral DMOS (double-diffused metal-oxide semiconductor) transistor in which the drain region has a portion with a low concentration of impurities, known as a "drift" or "drain extension" region, is known. FIGS. 1 and 2 show, in plan and in section respectively, a transistor of this type which constitutes part of an integrated circuit formed in a silicon substrate 10. A p-type region 11 formed in the substrate 10 constitutes the body region of the transistor. Various active areas are defined on the front surface of the substrate 10 and are insulated from one another by silicon dioxide (field oxide) plaques 12. The plaques 12 are defined by sides 12A such that the plaques 12 are formed in the area outside of a generally square area defined by the sides 12A. The plaques 12 may be formed, for example, by conventional techniques for the selective oxidation of the silicon. An n-type region 13 having a low concentration of impurities and indicated N−, extends in the body region 11 partially beneath a field oxide plaque 12 and constitutes the drift region of the transistor. An n-type region 14 having a high concentration and indicated N+ extends in the region 13, wholly occupying an active area, and constitutes the high-concentration portion of the drain region. A metal element 15 in contact with the region 14 constitutes the drain electrode D of the transistor. Another high-concentration n-type region 16 extends in the body region 11 and delimits, with the region 13, a channel 17. A metal element 18 in contact with the region 16 constitutes the source electrode S of the transistor. A strip 19 of electrically conductive material, for example, doped polycrystalline silicon, extends over the channel region and over a portion of the drift region 13 to form the gate electrode of the transistor. This strip is separated from the front surface of the substrate 10 by a thin layer 9 of insulating material which constitutes the gate dielectric. The strip 19 also extends partially over the plaque 12 which separates the two active areas in which the transistor is formed and, on top of the strip 19, there is a metal contact element 20 of the gate G. A p-type region 21 with a high concentration of impurities extends in the body region 11 to ensure an ohmic contact between this region and a metal element 22 which constitutes the body electrode B of the transistor.

As is known, when a voltage above a predetermined threshold is applied between the gate and body electrodes, the conductivity of the channel, that is, of the portion of the body region 11 beneath the gate electrode, is reversed so that a current can pass between the source electrode 18 and the drain electrode 15. In these conditions, the drift region 13 acts as a resistance distributed between the drain electrode 15 and the channel region 17 so that the potential of the drain region in the vicinity of the channel is lower than the drain-electrode potential.

This transistor can be formed by the same method as is used for conventional MOS and CMOS transistors of low-voltage logic circuits (2–3V) but, by virtue of the characteristic described above, can be used with higher supply voltages (7–8V). Some circuits which have to be supplied with high voltages, for example, control circuits for non-volatile memories, can therefore be produced with a smaller number of components and hence in smaller areas of the integrated circuit with the use of transistors of this type.

However, it is not possible to make the best use of the advantageous characteristics of the transistor described above because the voltage drop in the drift region when the transistor is conducting cannot be evaluated precisely at the stage of the design of the integrated circuit, because of the variability of the production parameters. To avoid the risk of the electric field formed between the gate electrode 19 and the drift region 13 in the vicinity of the channel 17 adopting values which are dangerous to the integrity of the gate dielectric 9, the device therefore has to be designed with quite large safety margins.

BRIEF SUMMARY OF THE INVENTION

An embodiment of the present invention directed to a lateral DMOS transistor which does not have the limitations described above.

The lateral DMOS transistor includes a substrate of semiconductor material having a front surface; a source region with a second type of conductivity extending in the substrate from the front surface; and a drain region with the second type of conductivity extending in the substrate from the front surface and delimiting one side of a channel region that is delimited on an opposite side by the source region. The drain region includes a first highly doped region spaced apart from the channel region and a relatively lightly doped drift region that extends from the channel region to the first highly doped region. The later DMOS transistor also includes a first drain electrode in contact with the first highly doped region of the drain region and a second drain electrode in contact with the drift region of the drain region.

BRIEF DESCRIPTION OF THE SEVERAL VIEWS OF THE DRAWINGS

The invention and the advantages resulting therefrom are described in detail below with reference to an embodiment thereof which is described by way of non-limiting example with reference to the appended drawings, in which.

DETAILED DESCRIPTION OF THE INVENTION

Figure 1:
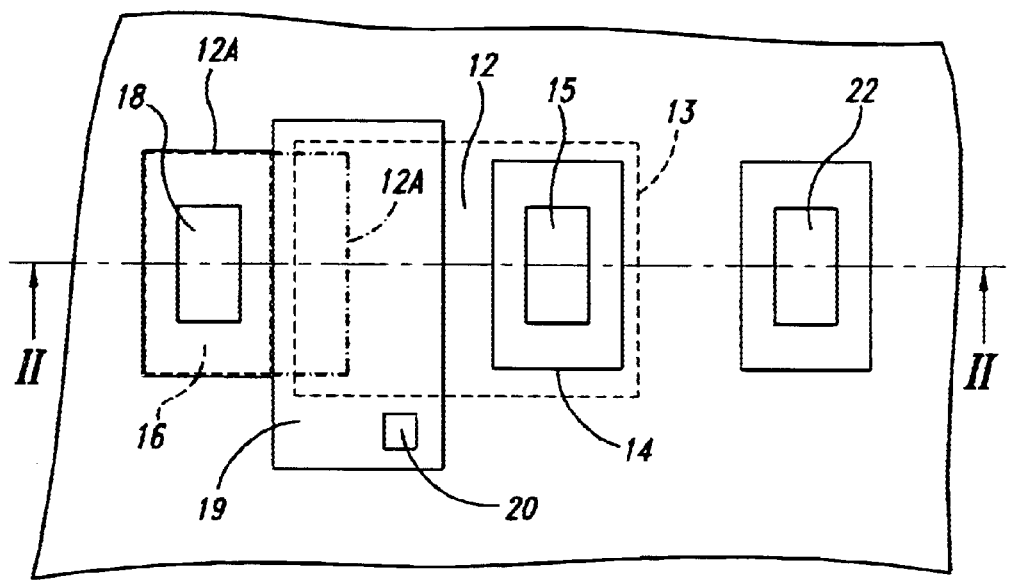
FIG. 1 is a plan view of a known lateral DMOS transistor.
Figure 2:
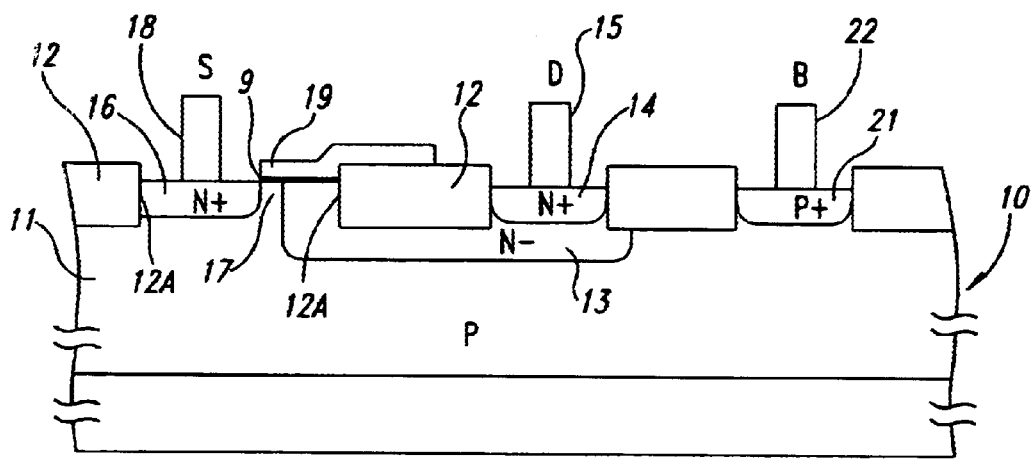
FIG. 2 is a section taken on the line II—II of FIG. 1.
Figure 3:
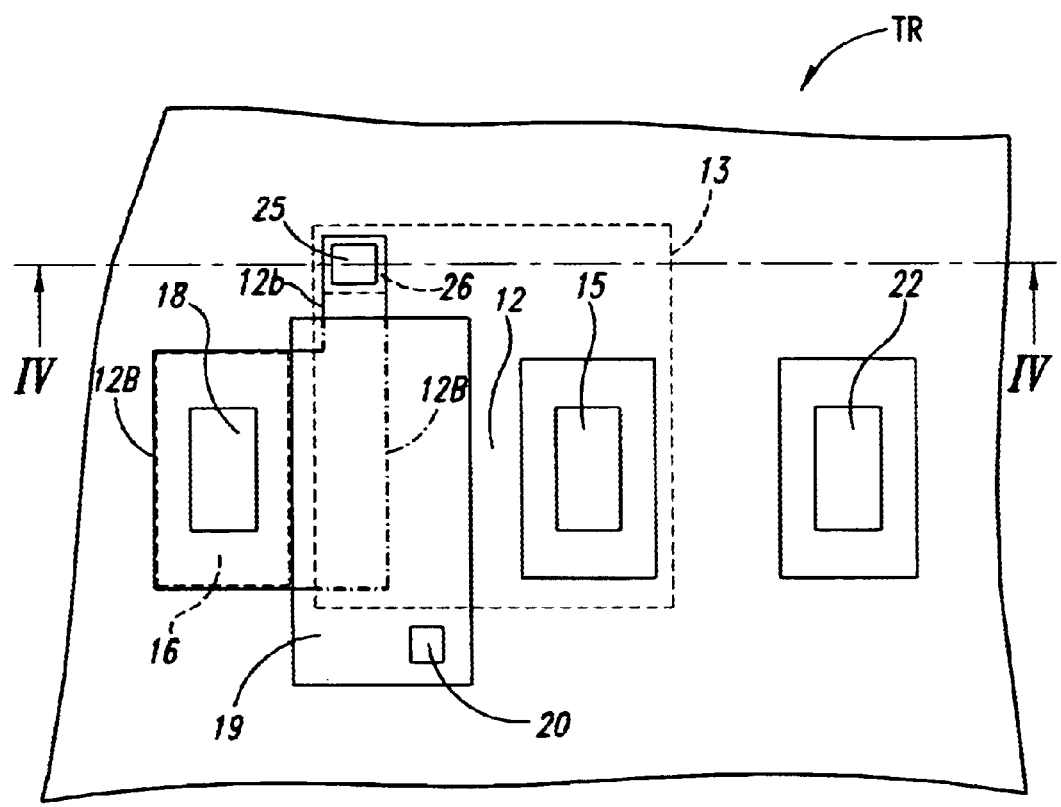
FIG. 3 is a plan view of a lateral DMOS transistor according to the invention.
Figure 4:
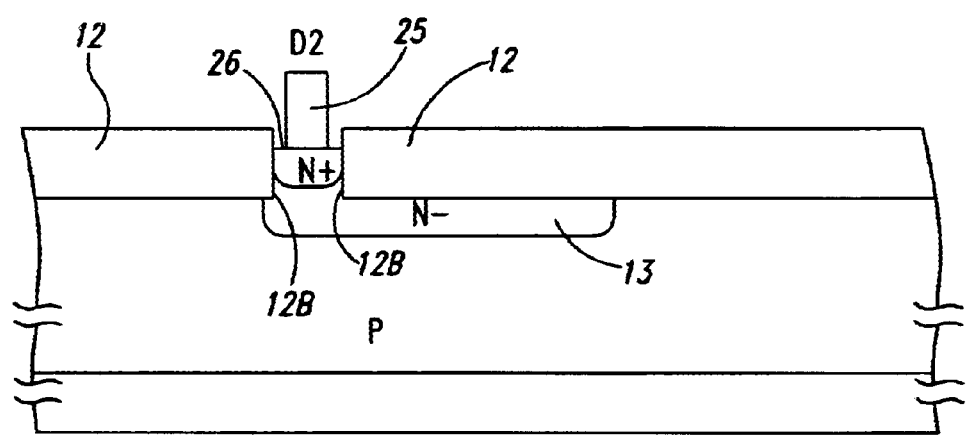
FIG. 4 is a section taken on the line IV—IV of FIG. 3.

FIG. 3, in which elements identical or corresponding to those of FIG. 1 are indicated by the same reference numerals, shows a lateral DMOS transistor TR according to the invention. It will be noted that the cross-section of FIG. 2 is also valid for the transistor TR. The latter differs from the known transistor shown in FIGS. 1 and 2 in that it comprises an additional contact electrode 25 disposed on the drift region 13. This additional contact electrode is disposed preferably at a point closer to the channel region 17 than to the high-concentration portion 14 of the drain region. The additional electrode 25 is in contact with the drift region by means of a high-concentration n-type region, indicated 26 in FIGS. 3 and 4. In this embodiment of the invention the additional electrode 25 is disposed beside the channel at a point at which it does not affect the conduction of the transistor and does not modify the effective width of the transistor. The n-type region 26 is disposed within an active area defined by sides 12B of the field oxide regions 12. As shown in FIG. 3, the active area defined by the sides 12B encompasses both the source region 16 and the n-type region 26.

The additional electrode permits a direct measurement of the potential of the drain region at a point very close to the channel. By taking such a measurement, the designer can thus obtain information useful for characterizing the transistor and for selecting its dimensions, and can thus optimize the electrical performance and the reliability both of the transistor itself and of the whole integrated circuit containing the transistor.

The information can be stored in a register to be used in the design of the integrated circuit or may be used directly by activating a protection circuit for preventing the application of excessive voltages to some components of the integrated circuit.

Figure 5:
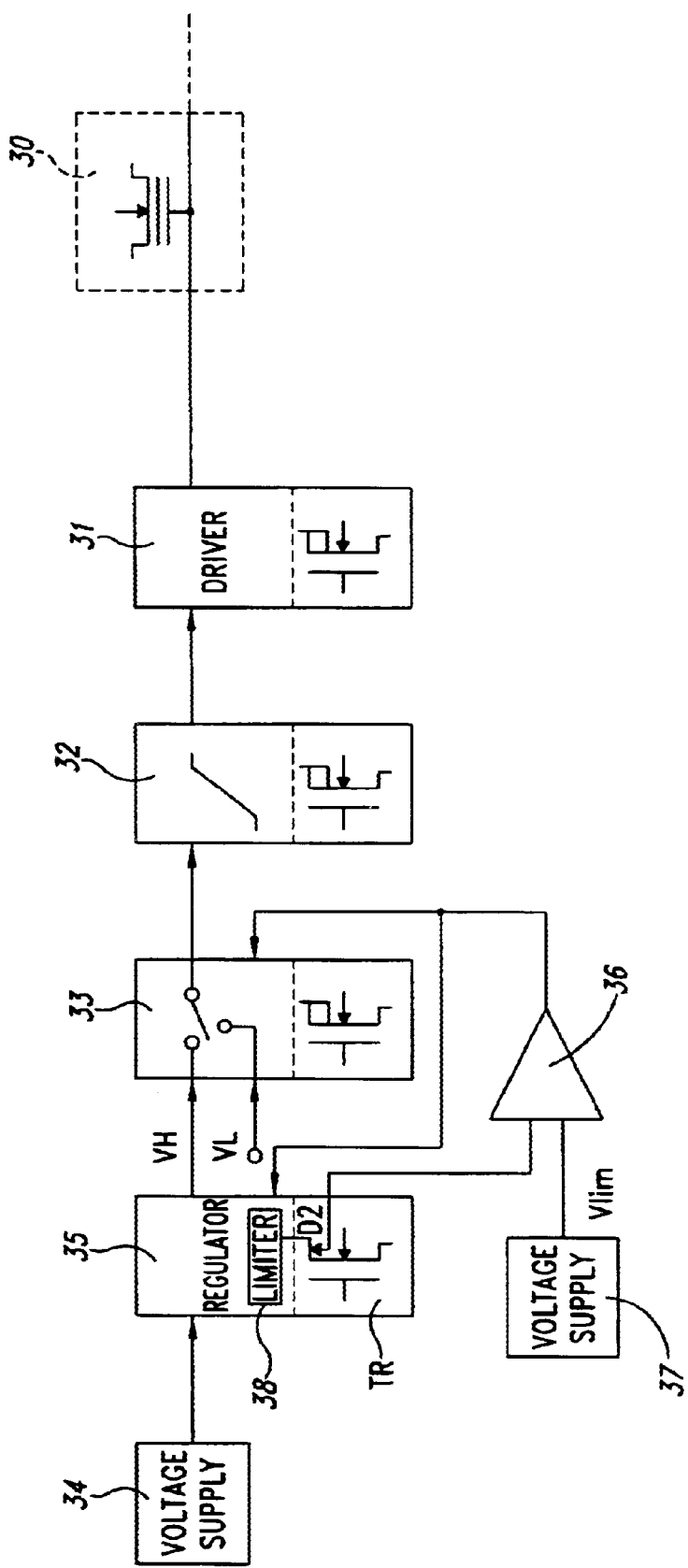
FIG. 5 shows, in schematic form, a portion of an integrated circuit in which the transistor of FIG. 3 is used.

FIG. 5 shows, in schematic form, an advantageous application of the transistor TR, more precisely, a row decoder of an EPROM memory. A generic EPROM cell, indicated 30, of a matrix of cells not shown further, has its gate terminal connected to the output of a high-voltage driver circuit 31. The amplitude of the voltage supplied by the driver circuit 31 is determined by a ramp-voltage generator 32. A switching device 33 controlled by a control logic circuit of the memory (not shown) can supply to the ramp-voltage generator 32 a high supply voltage VH or a low supply voltage VL. The high supply voltage VH is supplied by a voltage supply 34, for example, a charge pump, by means of a voltage regulator 35. The circuits of the row decoder advantageously use lateral DMOS transistors to withstand the fairly high voltages (7–8V) necessary to polarize the row of the matrix. More particularly, the circuits 31, 32 and 33 comprise transistors of the type shown in FIGS. 1 and 2 and the regulator 35 comprises at least one transistor TR according to the invention, such as that shown in FIGS. 3 and 4, supplied with the voltage provided by the supply 34.

According to the prior art, the circuits 31–33 are designed so as to take account of the fact that the potential of the drift region 13 in the vicinity of the channel 17 cannot be known precisely, as explained above with reference to FIGS. 1 and 2, so that the voltage between the sources and the drains of the lateral DMOS transistors has to be kept prudently low. Moreover, according to the prior art, it is necessary to take appropriate steps to protect the circuits from possible supply overvoltages and this requires limiters and other additional circuits.

These limitations of the prior art are completely eliminated with the use of the transistor TR, as explained below.

The transistor TR has its additional drain terminal, indicated D2, connected to a first input terminal of a comparator 36. A second input terminal of the comparator is connected to a voltage supply 37 which generates a constant voltage Vlim that can be set at the design stage at a safety value below the breakdown voltage of the gate dielectric. The output of the comparator is connected to the regulator 35. If the voltage at the additional terminal D2 is equal to or greater than the voltage Vlim, for example, because of a transient pulse in the supply 34, a signal appears at the output of the comparator 36 and activates suitable means, contained in the regulator 35, for protecting the transistor TR, for example, a limiter 38. Such a limiter 38 can be a voltage limiter or a current limiter, both of which are well known in the art. In the embodiment shown, the output of the comparator is also connected to the switching circuit 33 so that, in the event of overvoltages in the supply 34, the switch is activated and the high-voltage supply VH of the circuits 31, 32, and 33 is interrupted. Alternatively, the output signal of the comparator 36 can also be used to activate specific protection means of the lateral DMOS transistors.

As can be appreciated, the use of the transistor TR enables maximum use to be made of the advantageous characteristics of lateral DMOS transistors, by virtue of the fact that the additional terminal of the transistor TR permits a precise knowledge not only of the maximum voltage which can be withstood by the transistor TR, but also of that which can be withstood by lateral DMOS transistors without additional terminals. In fact, these are produced in the same integrated circuit by exactly the same process and are therefore identical to the transistor TR with regard to the maximum voltage which they can withstand. Moreover, in view of the fact that the function of protection against overvoltages in the supply is performed upstream of the circuits 31–33, specific circuit devices for protecting the individual circuits are not necessary. Finally, with the transistor TR, it is possible to produce circuits which are simpler and hence smaller than known circuits.

From the foregoing it will be appreciated that, although specific embodiments of the invention have been described herein for purposes of illustration, various modifications may be made without deviating from the spirit and scope of the invention. Accordingly, the invention is not limited except as by the appended claims.

In the claims:

1. A lateral DMOS transistor, comprising:
   a substrate of semiconductor material having a front surface;
   a body region with a first type of conductivity, extending in the substrate from the front surface;
   a source region and a drain region with a second type of conductivity, extending in the body region from the front surface and delimiting a channel region between them;
   a gate electrode which extends over the channel region and is insulated from the front surface by a layer of dielectric material;
   a body electrode, a source electrode, and a drain electrode which are in contact with the body region, the source region, and the drain region, respectively, the drain region comprising a high-concentration portion with which the drain electrode is in contact and a low-concentration portion which is delimited by the channel region; and
   an additional electrode in contact with the low-concentration portion of the drain region.

2. A transistor according to claim 1, in which the additional electrode is in contact with the low-concentration portion of the drain region at a point closer to the channel region than to the high-concentration portion of the drain region.

3. A transistor according to claim 2 in which the additional electrode is disposed beside the channel region.

4. An integrated circuit comprising;
   a first lateral DMOS transistor that includes:
      a substrate of semiconductor material having a front surface;

a body region with a first type of conductivity, extending in the substrate from the front surface;

a source region and a drain region with a second type of conductivity, extending in the body region from the front surface and delimiting a channel region between them;

a gate electrode which extends over the channel region and is insulated from the front surface by a layer of dielectric material;

a body electrode, a source electrode, and a drain electrode which are in contact with the body region, the source region, and the drain region, respectively, the drain region comprising a high-concentration portion with which the drain electrode is in contact and a low-concentration portion which is delimited by the channel region; and an additional electrode in contact with the low-concentration portion of the drain region;

a voltage comparator;

a source of a limit voltage; and means for protecting the transistor against overvoltages, in which the comparator has a first input terminal connected to the additional electrode of the transistor, a second input terminal connected to the source of the limit voltage, and an output terminal connected to the means for protecting the transistor, and generates an output signal when the voltage at its first input terminal is greater than the voltage at its second input terminal.

5. An integrated circuit according to claim 4 in which the protection means comprise a voltage limiter.

6. An integrated circuit according to claim 4, comprising a second lateral DMOS transistor and further means for protecting the second lateral DMOS transistor against overvoltages, in which the output terminal of the comparator is also connected to the further protection means.

7. An integrated circuit according to claim 6, comprising a row decoder of an EPROM memory having:

a voltage regulator that includes the first lateral DMOS transistor; and a circuit that includes the second lateral DMOS transistor.

8. An integrated circuit according to claim 7, in which the further protection means comprise at least one switching device.

9. A lateral DMOS transistor, comprising:

a substrate of semiconductor material having a front surface;

a body region with a first type of conductivity extending into the from the front surface:

a source region with a second type of conductivity extending in the body region from the front surface;

a drain region with the second type of conductivity extending in the body region from the front surface and delimiting one side of a channel region that is delimited on an opposite side by the source region, the drain region including a first highly doped region spaced apart from the channel region and a relatively lightly doped drift region that extends from the channel region to the first highly doped region;

a first drain electrode in contact with the first highly doped region of the drain region; and a second drain electrode in contact with the drift region of the drain region.

10. The transistor of claim 9, in which the second drain electrode is in contact with the drift region of the drain region at a point closer to the channel region than to the first highly doped region of the drain region.

11. The transistor of claim 9 wherein the drain region includes a second highly doped region positioned adjacent to the channel region, the second drain electrode contacting the drift region via the second highly doped region.

12. An integrated circuit comprising;

a first lateral DMOS transistor that includes:

a substrate of semiconductor material having a front surface;

a source region extending in the substrate from the front surface;

a drain region extending in the substrate from the front surface and delimiting one side of a channel region that is delimited on an opposite side by the source region, the drain region including a first highly doped region spaced apart from the channel region and a relatively lightly doped drift region that extends from the channel region to the first highly doped region;

a first drain electrode in contact with the first highly doped region of the drain region; and a second drain electrode in contact with the drift region of the drain region;

a limiter coupled to the first lateral DMOS transistor, the limiter being structured to protect the first lateral DMOS transistor; and a voltage comparator having a first input terminal connected to the additional electrode of the transistor, a second input terminal connected to a reference voltage, and an output terminal connected to the limiter, the voltage comparator being structured to activate the limiter when a voltage at the first input terminal is greater than the threshold voltage.

13. The integrated circuit of claim 12 in which the limiter includes a voltage limiter.

14. The integrated circuit of claim 12, further comprising a second lateral DMOS transistor and a switch for protecting the second lateral DMOS transistor against overvoltages, in which the output terminal of the comparator is also connected to the switch.

15. An integrated circuit according to claim 14, comprising a row decoder of an EPROM memory having:

a voltage regulator that includes the first lateral DMOS transistor; and a circuit that includes the second lateral DMOS transistor.

* * * * *